(12) United States Patent
Yokoyama

(10) Patent No.: US 7,824,188 B2
(45) Date of Patent: Nov. 2, 2010

(54) SOCKET FOR ELECTRIC COMPONENT WITH RADIATING MEMBER

(75) Inventor: Yuji Yokoyama, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 12/630,290

(22) Filed: Dec. 3, 2009

(65) Prior Publication Data
US 2010/0144190 A1 Jun. 10, 2010

(30) Foreign Application Priority Data
Dec. 4, 2008 (JP) .............................. 2008-309197

(51) Int. Cl.
*H01R 12/00* (2006.01)
(52) U.S. Cl. .................... 439/73; 439/331; 439/487
(58) Field of Classification Search ................... 439/73, 439/331, 487
See application file for complete search history.

(56) References Cited

U.S. PATENT DOCUMENTS

| | | | |
|---|---|---|---|
| 6,447,322 B1 * | 9/2002 | Yan et al. ................... | 439/331 |
| 6,752,645 B2 * | 6/2004 | Nakamura et al. .......... | 439/330 |
| 7,097,488 B2 * | 8/2006 | Hayakawa et al. .......... | 439/331 |
| 2005/0181656 A1 | 8/2005 | Hayakawa et al. | |

FOREIGN PATENT DOCUMENTS

JP    2005-149953    6/2005

* cited by examiner

*Primary Examiner*—Tho D Ta
(74) *Attorney, Agent, or Firm*—Finnegan, Henderson, Farabow, Garrett & Dunner, L.L.P.

(57) ABSTRACT

A socket for an electric component includes: a socket main body having a receiving portion which receives an electric component such as an IC package; a socket cover supported to be capable of turning by a first turning shaft provided in a vicinity of one side end of the socket main body to turn to thereby open or close the housing portion; and a radiating member mounted to the socket cover and is in contact with the electric component received in the receiving portion to radiate heat from the electric component in a state of the socket cover being closed. The socket cover has an opening portion formed in a position corresponding to the receiving portion of the socket main body in the closed state, and the radiating member is supported to be capable of turning by a second turning shaft parallel to the first turning shaft in the opening of the socket cover.

2 Claims, 8 Drawing Sheets

SOCKET FOR ELECTRIC COMPONENT WITH RADIATING MEMBER

CROSS-REFERENCE TO RELATED APPLICATION

This application is based upon the claims the benefit of priority of the prior Japanese Patent Application No. 2008-309197, filed on Dec. 4, 2008, the entire contents of which are incorporated herein by reference.

FIELD

The present invention relates to a socket for an electric component, which allows the electric component to radiate heat therefrom by bringing a radiating member in contact with the electric component received in a receiving portion of a socket main body in a state of a socket cover being closed, and particularly to a socket for an electric component, which prevents breakage or the like of the electric component by enabling the radiating member to substantially evenly press an upper surface of the electric component when the socket cover is closed.

BACKGROUND

Figure 8:
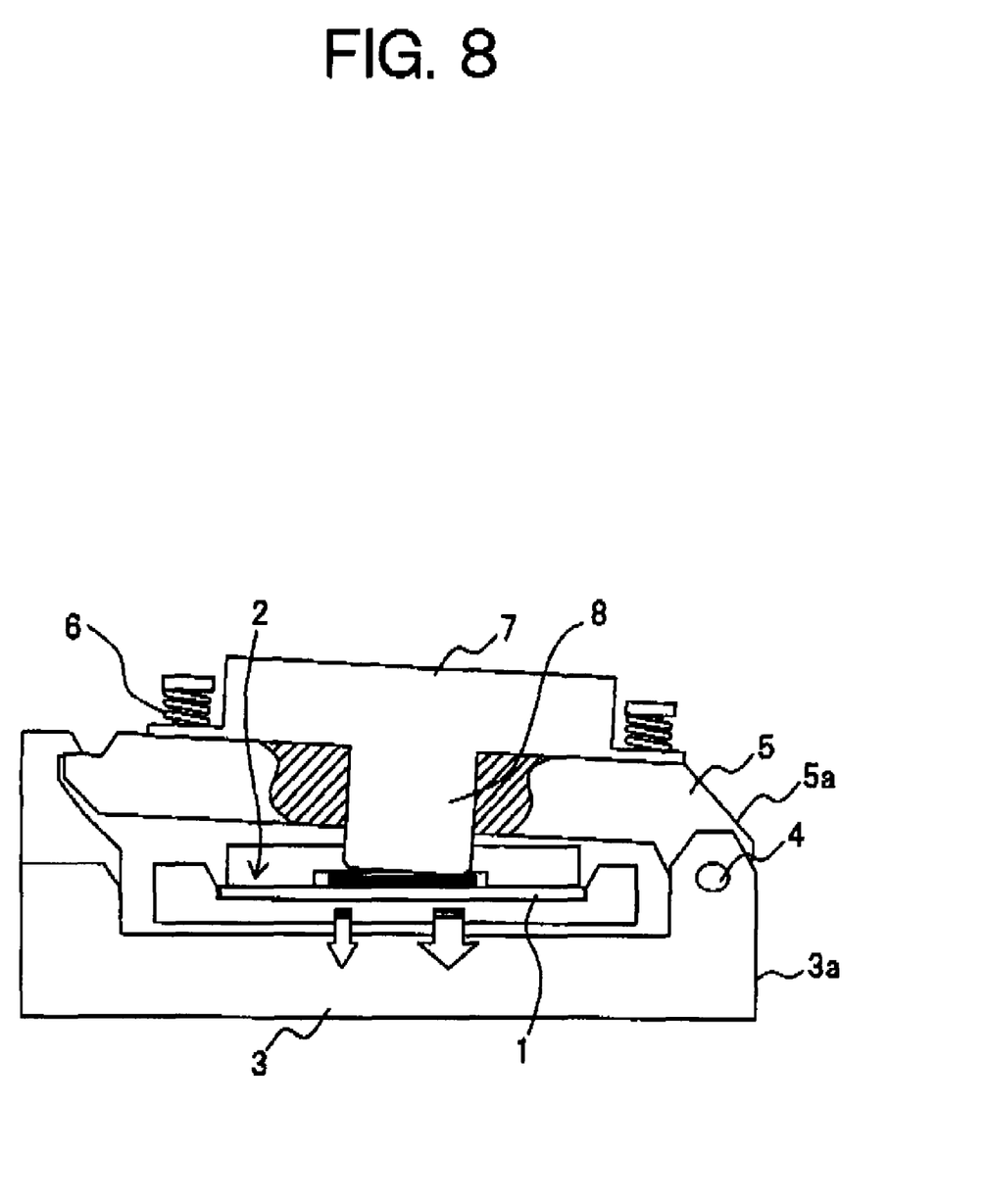
FIG. 8 is a view of a structure of a conventional socket for an electric component.

FIG. 8 illustrates an example of a conventional socket for an electric component. The socket for the electric component illustrated in FIG. 8 includes: a socket main body 3 having a receiving portion 2 for receiving an IC package 1 as the electric component; a socket cover 5 having a base end portion 5a supported to be capable of turning by a turning shaft 4 provided in a vicinity of one side end 3a of socket main body 3; and a radiating member 7 mounted on socket cover 5 while being biased by coil springs 6 to come in contact with IC package 1 received in receiving portion 2 to thereby radiate heat from IC package 1 in a state of socket cover 5 being closed (see Japanese Laid-Open Patent Publication No. 2005-149953, for example). To enhance radiation efficiency of IC package 1 in such a conventional socket for the electric component, it is necessary to increase biasing forces of coil springs 6 to thereby increase contact pressure between IC package 1 and radiating member 7, for example.

In the conventional socket for the electric component, radiating member 7 turns integrally with socket cover 5 having base end portion 5a supported to be capable of turning by turning shaft 4 provided in the vicinity of one side end 3a of socket main body 3. Thus, when socket cover 5 is closed, a lower end edge portion on turning shaft 4 side of a pressing portion 8 protruding from a lower portion of radiating member 7 may unevenly come in contact with an upper surface of IC package 1. Consequently, if the biasing forces of coil springs 6 are increased in this state, there may be a possibility that excessive pressing force is concentrated on a contact portion of the lower end edge portion to break the IC package.

SUMMARY

According to an aspect of the present invention, there is provided a socket for an electric component including: a socket main body having a receiving portion which receives an electric component; a socket cover supported to be capable of turning by a first turning shaft provided in a vicinity of one side end of the socket main body to turn to thereby open or close the receiving portion; and a radiating member mounted to the socket cover and is in contact with the electric component received in the receiving portion to radiate heat from the electric component in a state of the socket cover being closed. The socket cover has an opening portion formed in a position corresponding to the receiving portion of the socket main body in the closed state, and the radiating member is supported to be capable of turning by a second turning shaft parallel to the first turning shaft in the opening portion of the socket cover.

DESCRIPTION OF EMBODIMENTS

Figure 1A:
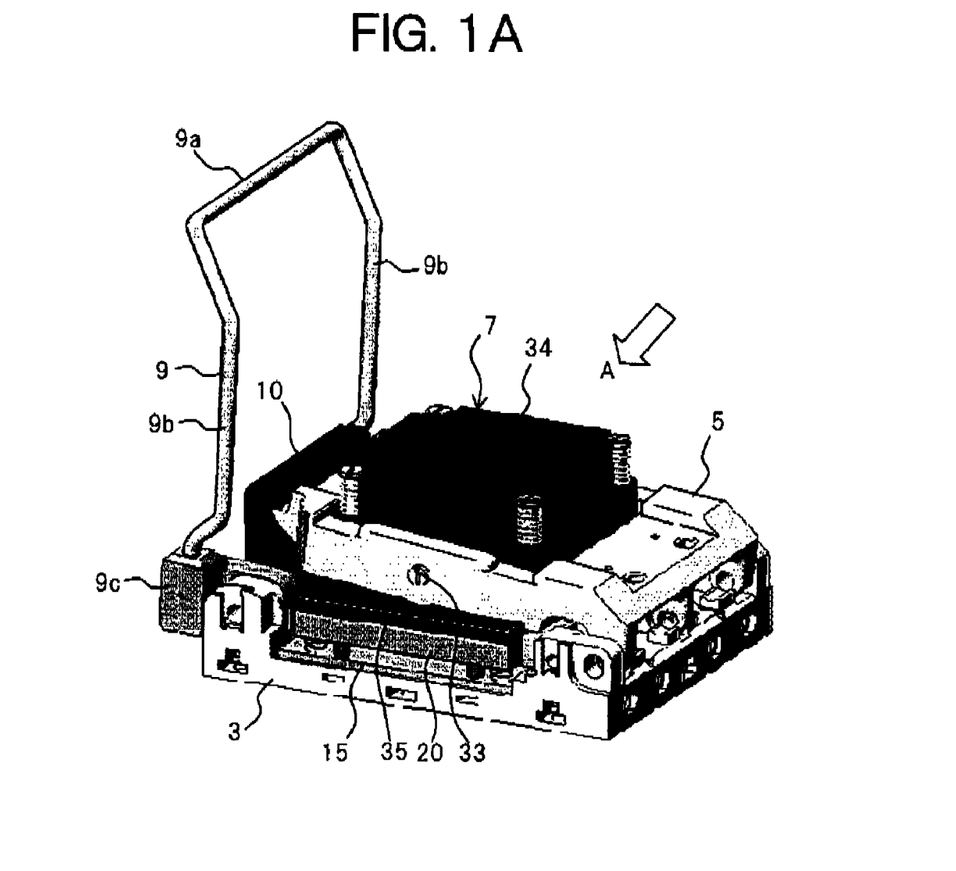
FIGS. 1A and 1B are perspective views of a schematic structure of a socket for an electric component according to an embodiment of the present invention.
Figure 1B:
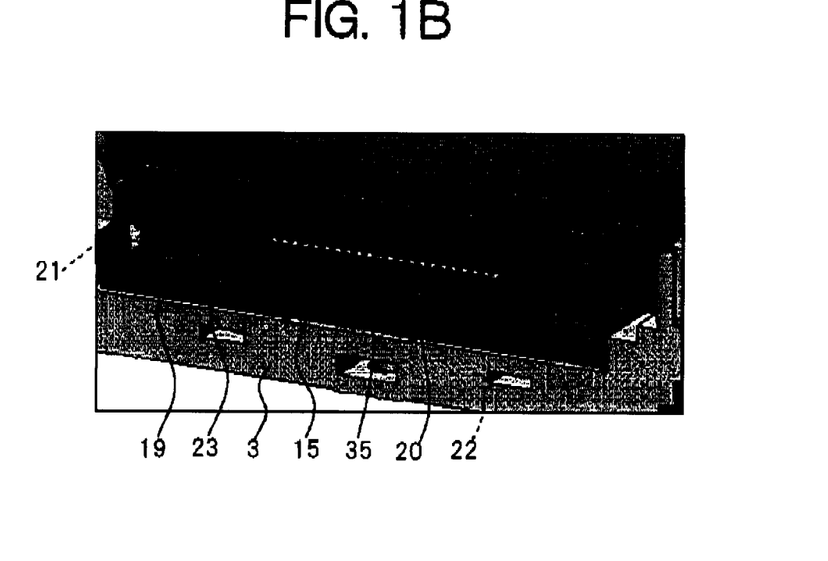
Figure 2:
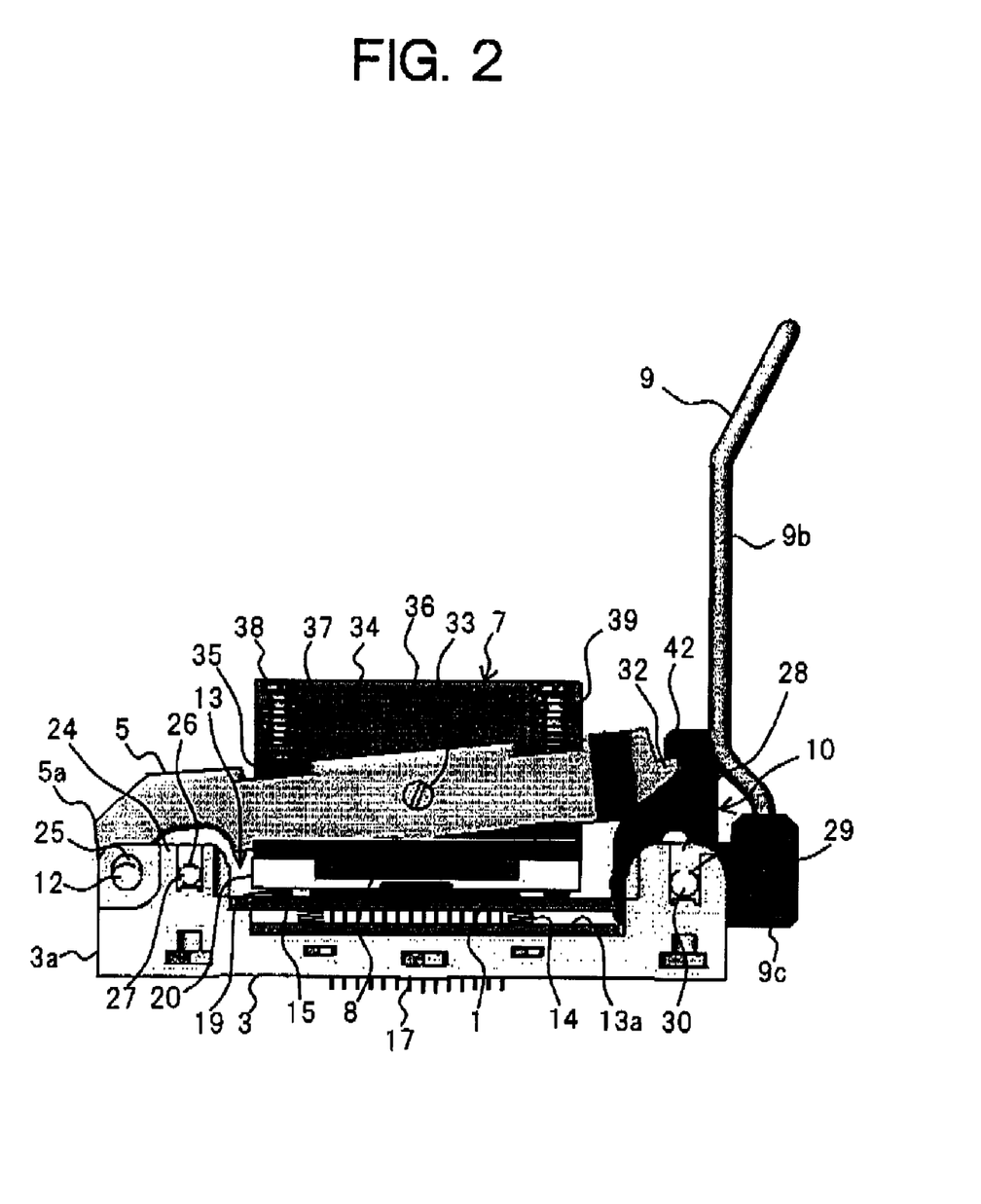
FIG. 2 is a view taken along an arrow A in FIG. 1A.

An embodiment of the present invention will be described below based on the accompanying drawings. FIGS. 1A and 1B are perspective views of a schematic structure of a socket for an electric component according to the embodiment of the invention. FIG. 1A is a general view illustrating an entire configuration and FIG. 1B is an enlarged view of a part of FIG. 1A. FIG. 2 is a view taken along an arrow A in FIG. 1A, and FIG. 3 is a cross-sectional view of FIG. 2.

Figure 4A:
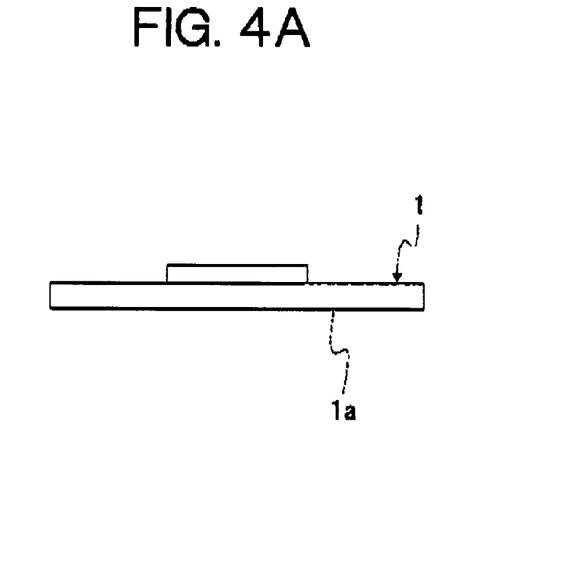
FIGS. 4A and 4B are views of an example of the IC package.
Figure 4B:
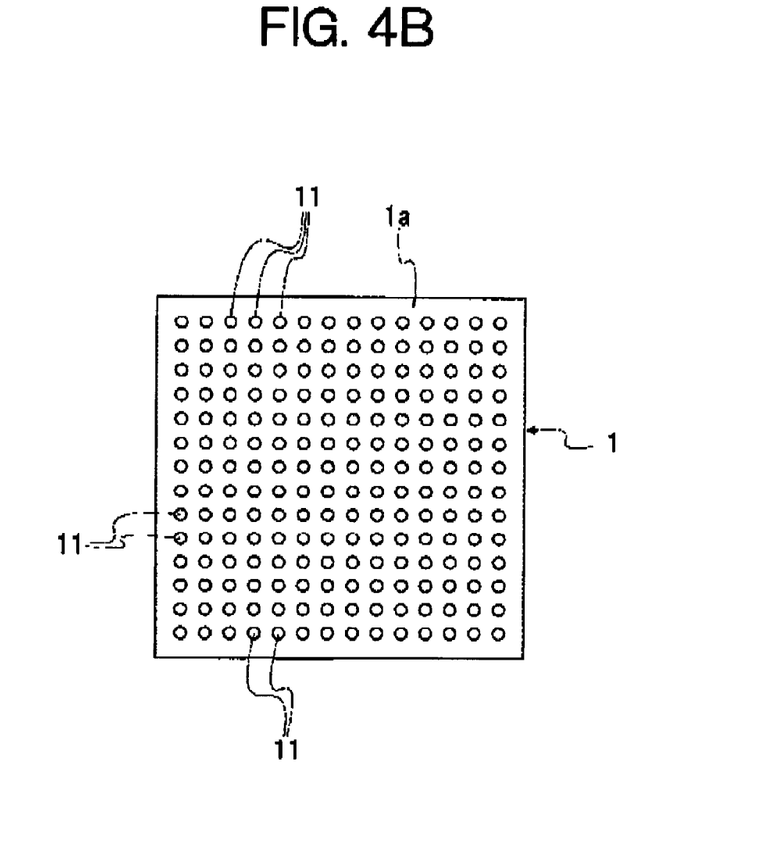

A socket for an electric component according to the present embodiment which conducts a performance test of an IC package as the electric component, includes, a socket main body 3, a socket cover 5, a radiating member 7, a lever member 9, and a latch member 10, and radiates heat from the IC package by bringing radiating member 7 in contact with the IC package received in a receiving portion of socket main body 3 in a state of socket cover 5 being closed. As illustrated in FIG. 4, IC package 1 in the embodiment has a substantially square package main body provided on a bottom surface 1a thereof with a plurality of terminal portions 11.

Figure 3:
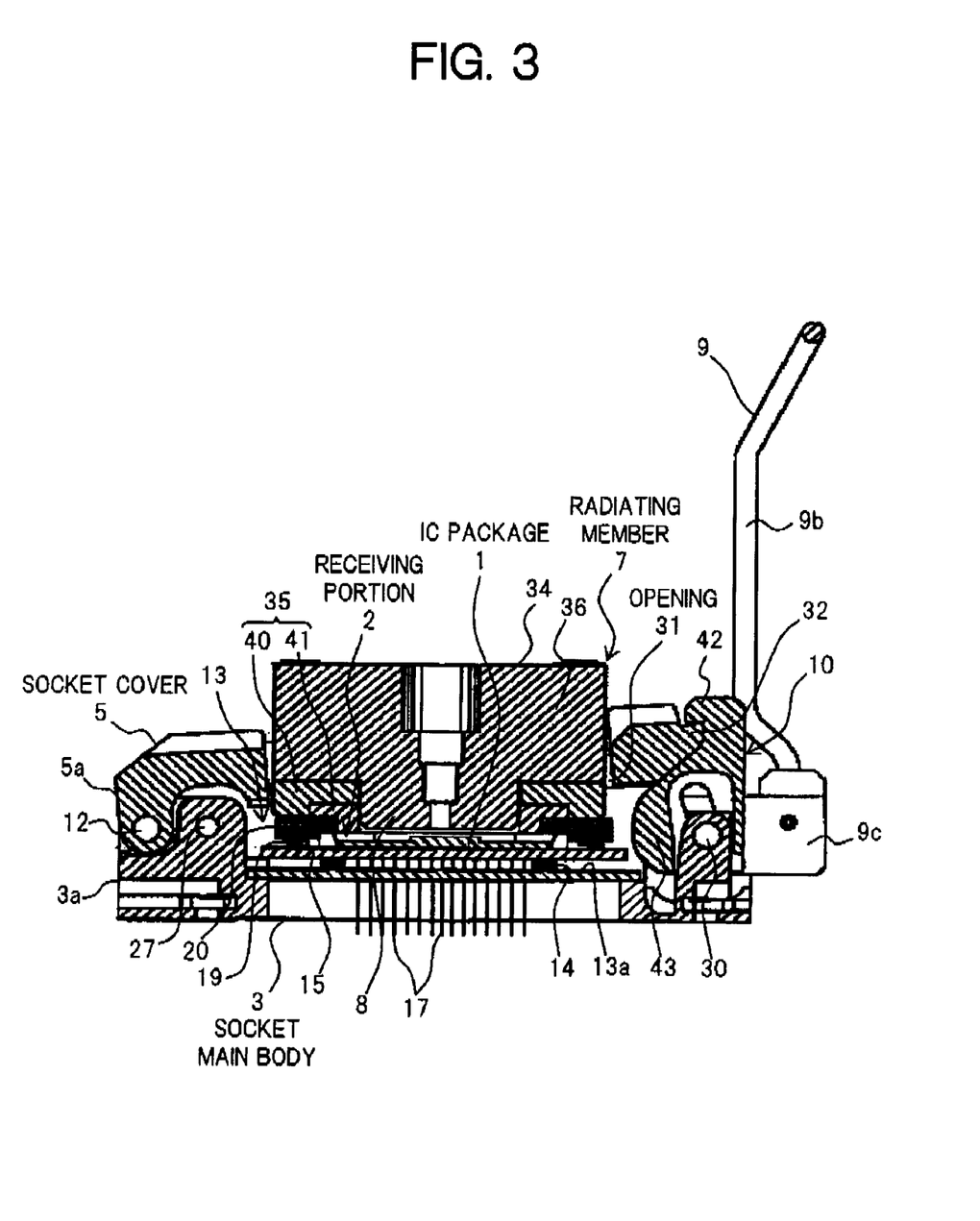
FIG. 3 is a vertical sectional view of FIG. 2.

As illustrated in FIG. 3, socket main body 3 supports, with a first turning shaft 12 provided in a vicinity of its one side end 3a, socket cover 5 to be capable of turning and has receiving portion 2 which receives IC package 1 in a central portion of an upper surface of the socket main body 3. Specifically, a recessed portion 13 is formed in the central portion of the upper surface of socket main body 3 and a square floating plate 15 having receiving portion 2 in its upper surface is disposed in recessed portion 13. Floating plate 15 is biased upward by first compression coil springs 14 fixed to a bottom surface 13a of recessed portion 13 so as to be able to elastically move up and down in recessed portion 13.

Here, the above description of "supports, with a first turning shaft 12 . . . , socket cover 5 to be capable of turning" includes both a case in which socket cover 5 turns as first turning shaft 12 turns and a case in which socket cover 5 turns about first turning shaft 12.

Figure 5:
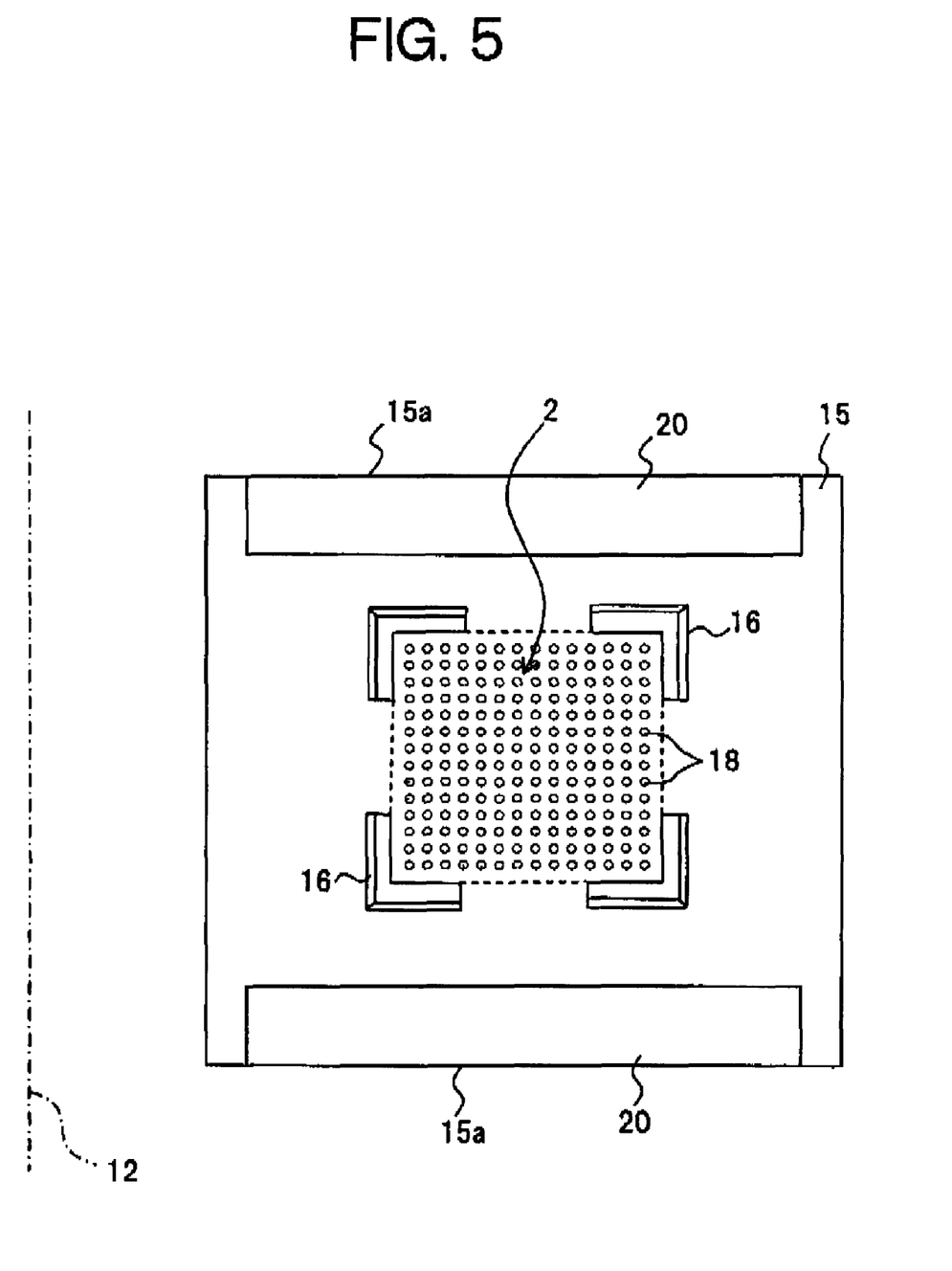
FIG. 5 is a view of an example of a floating plate used for the socket for the electric component.

As illustrated in FIG. 5, floating plate 15 is provided with four guide protrusions 16 and a plurality of insertion holes 18. The respective guide protrusions 16 are provided to four corner portions of receiving portion 2, and have a function of guiding IC package 1 into receiving portion 2. The respective insertion holes 18 are provided so that tip end portions of a plurality of contact pins 17 (see FIG. 3) embedded in bottom surface 13a of recessed portion 13 of socket main body 3 are inserted therethrough. Plurality of contact pins 17 are arranged in positions corresponding to the respective terminal portions 11 of IC package 1 received in receiving portion 2. On an upper surface of floating plate 15, beside sides of receiving portion 2 orthogonal to first turning shaft 12, i.e., as illustrated in FIG. 1B, in vicinities of two sides 15a of floating plate 15 orthogonal to first turning shaft 12, guide members 20 each biased upward by a pair of second compression coil springs 19 are provided. Guide members 20 come in contact with a peripheral edge area of a lower surface of a frame member 35 forming radiating member 7 described below and guides radiating member 7 (frame member 35) downward while keeping it substantially horizontal when socket cover 5 is closed.

As illustrated in FIG. 1B, each of guide members 20 is formed substantially in a prismatic bar shape and a pair of columnar recessed portions 21 is formed in vicinities of opposite ends of one side face of guide member 20. Each of second compression coil springs 19 has a lower end portion fixed to the upper surface of floating plate 15 and an upper portion inserted into recessed portion 21. Guide member 20 is biased upward by second compression coil springs 19. Moreover, a pair of columnar guide recessed portions 22 is formed on center sides of two recessed portions 21 in the one side face of guide member 20 and upper portions of guide poles 23 fixed to the upper surface of floating plate 15 are inserted into the respective guide recessed portions 22. With guide poles 23, guide member 20 is guided up and down while kept substantially horizontal.

Moreover, as illustrated in FIG. 2, on the upper surface of socket main body 3, a pair of first bearing portions 24 is formed to protrude in vicinities of one side end 3a. In the respective first bearing portions 24, first through holes 25 in shapes of vertically elongated holes that are long in a vertical direction are formed, and first turning shaft 12 is inserted through pair of first through holes 25. In first bearing portions 24, second through holes 26 are formed beside recessed portion 13 to be adjacent to first through holes 25, and a shaft member 27 is inserted through pair of second through holes 26. On an opposite side of first bearing portions 24 across recessed portion 13, a pair of second bearing portions 28 is formed to protrude from the upper surface of socket main body 3. Third through holes 29 are formed in the respective second bearing portions 28, and a third turning shaft 30 mounted with lever member 9 described later is inserted through the pair of third through holes 29. The second turning shaft will be described later.

In the vicinity of one side end 3a of socket main body 3, socket cover 5 is provided to be capable of turning. Socket cover 5 is supported by first turning shaft 12 to be capable of turning at its base end portion 5a. Socket cover 5 turns as first turning shaft 12 turns or turns about first turning shaft 12 to thereby open or close housing portion 2 of socket main body 3. In the embodiment, as illustrated in FIG. 3, socket cover 5 has a substantially square opening portion 31 formed to pass through a central portion of socket cover 5 in a thickness direction, and radiating member 7 described later is provided in opening portion 31. At an end portion of socket cover 5 on an opposite side to base end portion 5a, a locking portion 32 to be engaged with a locking hook (latch hook) 42 of latch member 10 described later is formed to protrude outward.

Here, a first torsion coil spring (not shown) is wound around first turning shaft 12 and has one end in contact with a lower surface of closed socket cover 5 and the other end in contact with the upper surface of socket main body 3. As a result, a biasing force in an opening direction is constantly applied to socket cover 5. A second torsion coil spring (not shown) is wound around shaft member 27 provided to be adjacent to first turning shaft 12 and has one end extending above first turning shaft 12 and the other end fixed to socket main body 3. As a result, a downward biasing force is constantly applied to first turning shaft 12. When socket cover 5 is closed, especially when locking portion 32 side of socket cover 5 is engaged with latch member 10 and pushed down, first turning shaft 12 moves upward from lower positions in vertically elongated first through holes 25 against the biasing force of the second torsion coil spring so that socket cover 5 becomes substantially horizontal when it is closed. Therefore, when socket cover 5 is closed, it is possible to suppress uneven pressing of IC package 1 with radiating member 7 and resultant application of excessive force to IC package 1.

Radiating member 7 is provided in opening portion 31 formed in socket cover 5 and supported to be capable of turning by second turning shaft 33 (see FIG. 2) parallel to first turning shaft 12. Radiating member 7 comes in contact with an upper surface of IC package 1 received in receiving portion 2 to radiate heat from IC package 1 and includes a pressing portion 8 which presses the upper surface of IC package 1 received in receiving portion 2 in the state of socket cover 5 being closed, and a plurality of radiating fins 34 which radiates heat generated in IC package 1 to an outside. Here, "Radiating member 7 is supported to be capable of turning by second turning shaft 33" includes both a case in which radiating member 7 turns as second turning shaft 33 turns and a case in which radiating member 7 turns about second turning shaft 33 (the same will be applied to frame member 35 described later). Second turning shaft 33 may be composed of one shaft passing through radiating member 7, or may be composed of a pair of shaft members, the respective shaft members is provided on a front side and a back side of socket cover 5 in FIG. 2. In the embodiment, second turning shaft 33 is fixed to socket cover 5, and radiating member 7 turns about second turning shaft 33.

Concretely, as illustrated in FIG. 3, radiating member 7 in the embodiment includes substantially square frame member 35 received in opening portion 31 in socket cover 5 and supported to be capable of turning by second turning shaft 33, and a heat sink 36 mounted to frame member 35. Frame member 35 presses down, with the peripheral edge area of its lower surface, upper surfaces of guide members 20 when socket cover 5 is closed. Heat sink 36 has, on its upper portion, a plurality of radiating fins 34 and, on its lower portion, pressing portion 8 that is formed to protrude. Heat sink 36 is fixed to an upper surface of frame member 35 with pressing portion 8 inserted into frame member 35. Here, as illustrated in FIGS. 1A and 2, mounting portions 37 are formed at four corner portions of heat sink 36 and heat sink 36 is mounted on frame member 35 by screws 38 through mounting portions 37. In FIG. 2, a reference numeral 39 designates a compression coil spring which biases heat sink 36 toward frame member 35 and heat sink 36 is elastically brought in contact with frame member 35 by the compression coil springs.

Frame member 35 in the embodiment is composed of a first member 40 in a lower surface of which a recessed portion having a predetermined shape and a predetermined depth is formed around the opening and a second member 41 mounted in the recessed portion of first member 40 and having a lower surface protruding downward from the lower surface of first member 40 in the state of socket cover 5 being closed illustrated in FIG. 3. However, frame member 35 is not limited to this structure and it may be composed of one member (e.g., a plate frame). In FIG. 3, although a lower surface of pressing portion 8 of heat sink 36 is located in a slightly upper position than the lower surface of second member 41 (i.e., the lower surface of frame member 35), pressing portion 8 of heat sink 36 may be formed to protrude from the lower surface of frame member 35.

Lever member 9 is provided to face socket cover 5 in an opened state with receiving portion 2 in socket main body 3 interposed therebetween. Lever member 9 is configured to move latch member 10 described later up and down, and as illustrated in FIG. 1A, lever member 9 has a substantially U shape and base end portions 9c that are tip ends of left and right arm portions 9b extending parallel to each other from an operation portion 9a and are mounted to third turning shaft 30 inserted through third through holes 29 in second bearing portions 28 of socket main body 3. Lever member 9 turns with third turning shaft 30 to be tilted and raised. Here, lever member 9 is formed so that an interval between left and right arm portions 9b is wider than an interval between sides (side faces) of socket cover 5 orthogonal to first turning shaft 12. Operation portion 9a sides of left and right arm portions 9b are bent so that operation portion 9a is positioned diagonally above arm portions 9b when lever member 9 is tilted.

Figure 6A:
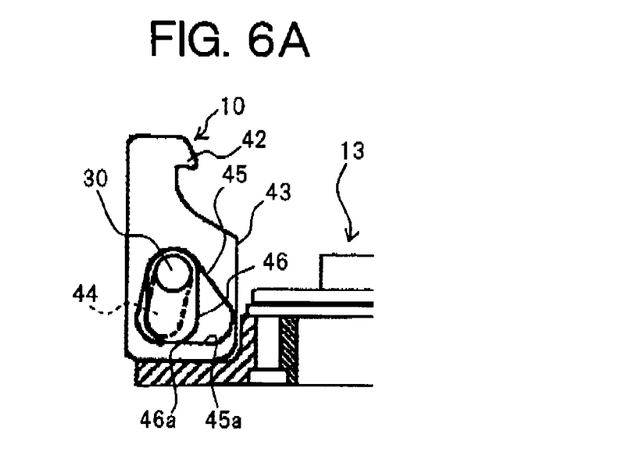
FIGS. 6A to 6C are an explanatory view of operation of a latch member used for the socket for the electric component.
Figure 6B:
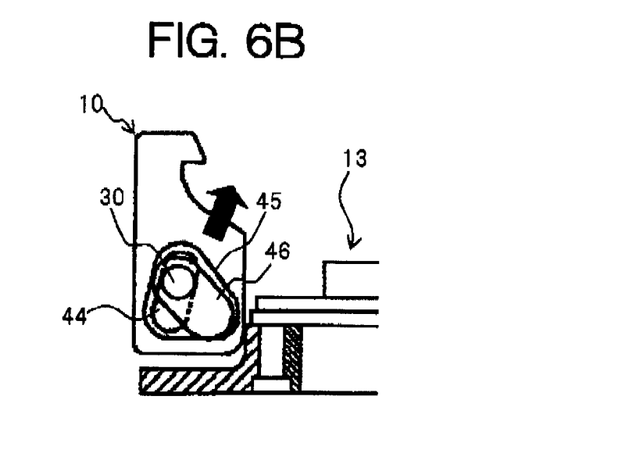
Figure 6C:
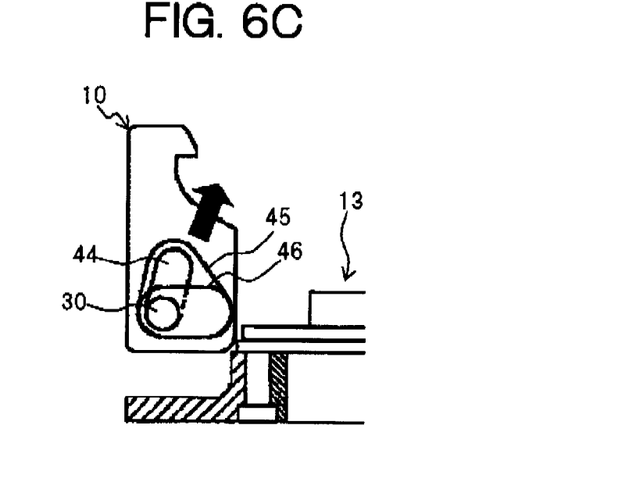

Between base end portions 9c opposite to each other of lever member 9, latch member 10 through which third turning shaft 30 is inserted is provided. Latch member 10 moves up and down in synchronization with the tilting and raising of lever member 9. Concretely, latch member 10 pushes down the opposite side of socket cover 5 to base end portion 5a side as lever member 9 is tilted to retain socket cover 5 in the closed state, and at the same time, presses the upper surface of IC package 1 in receiving portion 2 against pressing portion 8 of radiating member 7. As shown in FIG. 6, latch member 10 is in a shape having, at its upper portion, locking hook 42 to be engaged with locking portion 32 of socket cover 5 and having a bulging body portion 43 under locking hook 42, and further, latch member 10 is biased upward by a spring member (not shown). A vertically elongated hole 44 inclined with respect to the vertical direction toward receiving portion 2 side in socket main body 3 is formed in body portion 43, and third turning shaft 30 is inserted through vertically elongated hole 44. In at least one of side faces of latch member 10 orthogonal to third turning shaft 30, a substantially triangular recessed portion 45 having a side parallel to a longitudinal direction of vertically elongated hole 44 is formed to dispose vertically elongated hole 44 inside. In recessed portion 45, a cam 46 fixed to third turning shaft 30 is disposed. A tip end portion 46a of cam 46 is in contact with a lower side surface 45a of recessed portion 45 and slides on lower side surface 45a of recessed portion 45 as lever member 9 is tilted and raised. Here, as described above, vertically elongated hole 44 is formed to be inclined from a lower portion to an upper portion toward receiving portion 2 (recessed portion 13) in socket main body 3. Therefore, when lever member 9 is in a raised state, latch member 10 is biased by the spring member to be diagonally raised toward receiving portion 2 (recessed portion 13) in socket main body 3 as illustrated with arrows in FIGS. 6B and 6C. In this way, it is possible to easily engage locking portion 32 of socket cover 5 and locking hook 42 of latch member 10 with each other when socket cover 5 is closed.

Next, operation of the socket for the electric component formed as described above will be described.

Figure 7A:
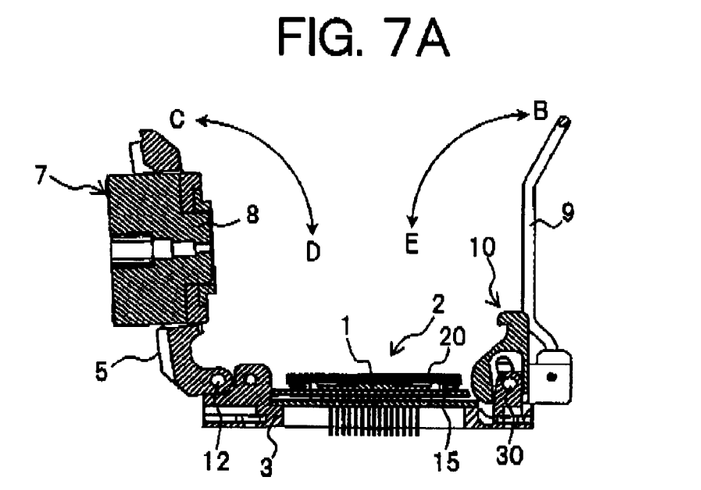
FIGS. 7A to 7C are an explanatory view of operation of the socket for the electric component.

First, as illustrated in FIG. 7A, lever member 9 is turned in a direction of an arrow B and raised. At this time, as illustrated in FIGS. 6A to 6C, cam 46 provided to third turning shaft 30 turns counterclockwise. In other words, tip end portion 46a of cam 46 moves from a left position to a right position while in contact with lower side surface 45a of recessed portion 45 of latch member 10. As a result, latch member 10 is raised diagonally toward receiving portion 2 (recessed portion 13) as illustrated with the arrows in the drawings by the biasing force of the spring member (not shown), and locking portion 32 of socket cover 5 and locking hook 42 of latch member 10 are disengaged from each other. As a result, socket cover 5 turns and rises in a direction of an arrow C as illustrated in FIG. 7A due to the biasing force of the first torsion coil spring (not shown) wound around first turning shaft 12 to open a top of receiving portion 2 of socket main body 3. At this time, floating plate 15 and guide members 20 are biased by first compression coil springs 14 and second compression coil springs 19, respectively, to rise to highest positions in their movable ranges.

Next, IC package 1 is put into receiving portion 2 from above. At this time, a peripheral edge portion of IC package 1 is guided by guide protrusions 16 (see FIG. 5) and IC package 1 is smoothly received in receiving portion 2.

Figure 7B:
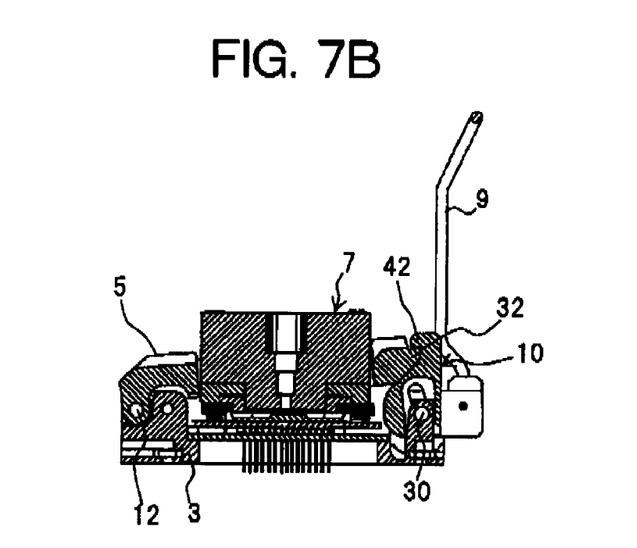

Then, as illustrated in FIG. 7B, socket cover 5 is turned in a direction of an arrow D (see FIG. 7A) and receiving portion 2 of socket main body 3 is closed. At this time, locking portion 32 of socket cover 5 and locking hook 42 of latch member 10 are engaged with each other and socket cover 5 is maintained in the closed state. Radiating member 7 is supported to be capable of turning by second turning shaft 33 provided to socket cover 5 and, as illustrated in FIG. 2, the lower surface of radiating member 7 (frame member 35) evenly comes in contact with the upper surfaces of guide members 20. At this stage, however, pressing portion 8 of heat sink 36 has not yet come in contact with the upper surface of IC package 1.

Figure 7C:
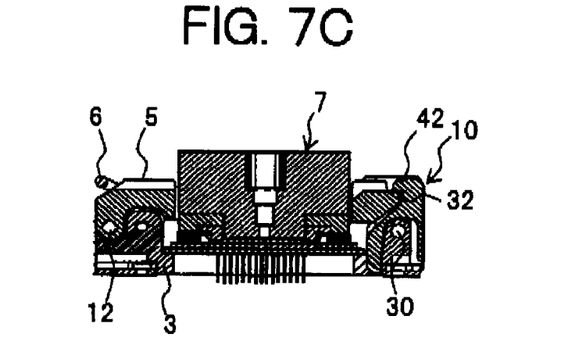

Further, as illustrated in FIG. 7C, when lever member 9 is turned in a direction of an arrow E (see FIG. 7A) and tilted, operations illustrated in FIGS. 6A to 6C are carried out in reverse order. In other words, cam 46 provided to third turning shaft 30 rotates clockwise in the drawings, and tip end portion 46a of cam 46 moves from the right position to the left position while in contact with lower side surface 45a of recessed portion 45 of latch member 10. As a result, lower side surface 45a of recessed portion 45 of latch member 10 is pushed by tip end portion 46a of cam 46, latch member 10 diagonally moves down in an opposite direction to the direction of the arrows in the drawings, so that the end portion of socket cover 5 on locking portion 32 side is pushed down.

As the end portion of socket cover 5 on locking portion 32 side is pushed down by latch member 10, floating plate 15 and guide members 20 are pushed down against the biasing forces of first compression coil springs 14 and second compression coil springs 19, respectively. At this time, guide members 20 move down while kept substantially horizontal by guide poles 23, and thus, radiating member 7 with its lower surface (the lower surface of frame member 35) in contact with the upper surfaces of guide members 20 is guided downward while slightly turning about second turning shaft 33 (see FIG. 22) and kept horizontal. In this way, pressing portion 8 of heat sink 36 of radiating member 7 substantially evenly comes in contact with the upper surface of IC package 1. Then, when lever member 9 is completely tilted and socket cover 5 is completely closed, floating plate 15 moves down to a lowest position in its movable range. When floating plate 15 moves down to the lowest position, tip ends of contact pins 17 (see FIG. 5) are exposed from the respective insertion holes 18 formed in floating plate 15, or move relatively in insertion holes 18 to electrically come in contact with respective terminal portions 11 of IC package 1. At this time, first turning shaft 12 side of socket cover 5 slightly rises against the biasing force of the second torsion coil spring (not shown) which is wound around shaft member 27 and biases first turning shaft 12 downward, and socket cover 5 is kept substantially horizontal. Therefore, it is possible to suppress application of excessive pressing force to IC package 1 by radiating member 7 when socket cover 5 is closed.

The biasing forces of first compression coil springs 14 and second compression coil springs 19 may be equal to each other, or one of them may be greater than the other. When elastic coefficient of first compression coil springs 14 is greater than that of second compression coil springs 19, second compression coil springs 19 are elastically deformed earlier and guide members 20 move down earlier to the lowest position in its movable range. On the other hand, when the elastic coefficient of second compression coil springs 19 is greater than that of first compression coil springs 14, first compression coil springs 14 are elastically deformed earlier and floating plate 15 moves down earlier to the lowest position in its movable range.

In the above-mentioned embodiment, although radiating member 7 is composed of two members, i.e., frame member 35 and heat sink 38, the structure is no limited to this and it is needless to say that radiating member 7 may be composed one member. In other words, radiating member 7 may be integrally provided with pressing portion 8 in a lower position thereof and plurality of radiating fins 34 in a higher position thereof in the closed state of socket cover 5.

The socket for the electric component according to the embodiment includes: socket main body 3 having receiving portion 2 which receives the electric component such as IC package 1; socket cover 5 supported to be capable of turning by first turning shaft 12 provided in the vicinity of one side end 3a of socket main body 3 to turn to thereby open or close receiving portion 2; and radiating member 7 mounted to socket cover 5 and is in contact with the electric component received in receiving portion 2 to radiate heat from the electric component in the state of socket cover 5 being closed. Socket cover 5 is provided with opening portion 31 in a position corresponding to receiving portion 2 of socket main body 3 in the closed state, and radiating member 7 is supported to be capable of turning by second turning shaft 33 parallel to first turning shaft 12 in opening portion 31 of socket cover 5.

With this structure, in the socket for the electric component according to the above embodiment, the electric component such as IC package 1 is received in receiving portion 2 of socket main body 3, socket cover 5 supported to be capable of turning by first turning shaft 12 provided in the vicinity of one side end 3a of socket main body 3 is turned to open or close receiving portion 2, and radiating member 7 mounted to socket cover 5 is brought in contact with the electric component in receiving portion 2 to radiate the heat of the component when socket cover 5 is closed. Here, radiating member 7 is supported to be capable of turning by second turning shaft 33 parallel to first turning shaft 12 in opening portion 31 formed in socket cover 5 to correspond to receiving portion 2 of socket main body 3 when socket cover 5 is closed.

Therefore, according to the socket for the electric component of the embodiment, when socket cover 5 is closed, pressing portion 8 formed to protrude from the lower portion of radiating member 7 can substantially evenly press the upper surface of the electric component 1. As a result, the radiation efficiency of the electric component by radiating member 7 can be improved, uneven contact of radiating member 7 (pressing portion 8) with the upper surface of the electric component can be suppressed, and breakage of the electric component can be prevented. For example, if the electric component has the terminal portions on its lower surface side and it is necessary to bring the terminal portions in contact with contact pins 17 in receiving portion 2, it is possible to stably bring the terminal portions of the electric component and contact pins 17 in contact with each other. Therefore, it is possible to reliably make an electrical connection between them.

Moreover, socket main body 3 includes guide members 20 disposed on sides of receiving portion 2 orthogonal to first turning shaft 12, i.e., outside receiving portion 2 in a direction orthogonal to first turning shaft 12. Guide members 20 are biased upward by elastic members (second compression coil springs 19) and come in contact with the peripheral edge area of the lower surface of radiating member 7 (frame member 35) to guide radiating member 7 downward while keeping radiating member 7 substantially horizontal when socket cover 5 is closed. In other words, guide members 20 are biased upward by the elastic members and come in contact with the peripheral edge area of the lower surface of radiating member 7 (frame member 35) to allow radiating member 7 to move down while kept in the substantially horizontal state.

As a result, it is possible to further effectively suppress uneven contact of radiating member 7 (pressing portion 8) with the upper surface of the electric component to obtain surface contact between radiating member 7 (pressing portion 8) and the upper surface of the electric component to thereby further improve the radiation efficiency.

Moreover, radiating member 7 includes frame member 35 supported to be capable of turning by second turning shaft 33, and heat sink 36 provided, at the lower portion thereof, with pressing portion 8 which presses the upper surface of the electric component in the state of socket cover 5 being closed and, at the upper portion thereof, with a plurality of radiating fins 34 which radiates the heat generated in the electric component. Heat sink 36 is fixed to the upper surface of frame member 35 with pressing portion 8 inserted in frame member 35.

Therefore, a degree of freedom in design of heat sink 36 can be increased and the heat sink with higher radiation efficiency can be employed. Moreover, if only heat sink 36 is configured so as to be detachable, heat sink 36 can be replaced according to the electric component received in receiving portion 2, so that suitable radiation can be carried out. When at least one of pressing portion 8 and radiating fins 34 is damaged due to repeated use and needs to be replaced, only heat sink 36 may be replaced, which results in excellent maintainability and can reduce the cost on the whole.

Although the invention has been described in the specific embodiment, the invention is not limited to the embodiment and it should be understood that a person skilled in the art can make various improvements and changes without departing from the spirit and the scope of the invention.

What is claimed is:

1. A socket for an electric component comprising:
   a socket main body having a receiving portion which receives an electric component;
   a socket cover supported to be capable of turning by a first turning shaft provided in a vicinity of one side end of the socket main body to turn to thereby open or close the receiving portion; and
   a radiating member mounted to the socket cover and is in contact with the electric component received in the receiving portion to radiate heat from the electric component in a state of the socket cover being closed, wherein the socket cover has an opening portion formed in a position corresponding to the receiving portion of the socket main body in the state of the socket cover being closed, the radiating member is supported to be capable of turning by a second turning shaft parallel to the first turning shaft in the opening portion of the socket cover the socket main body includes a guide member disposed outside the receiving portion in a direction orthogonal to the first turning shaft, and the guide member is biased upward by an elastic member and comes in contact with at least a peripheral edge area of a lower surface of the radiating member to allow the radiating member to move down while kept in a substantially horizontal state when the socket cover is closed.

2. The socket for an electric component according to claim 1, wherein the radiating member includes a frame member supported to be capable of turning by the second turning shaft and a heat sink provided, at a lower portion thereof, with a pressing portion which presses an upper surface of the electric component in the state of the socket cover being closed, and at an upper portion thereof, with a plurality of radiating fins which radiates heat generated in the electric component and the heat sink is fixed to an upper surface of the frame member with the pressing portion inserted in the frame member.

* * * * *